United States Patent [19]
Fifield et al.

[11] Patent Number: 6,118,318
[45] Date of Patent: Sep. 12, 2000

[54] SELF BIASED DIFFERENTIAL AMPLIFIER WITH HYSTERESIS

[75] Inventors: John A. Fifield, Underhill; Lawrence G. Heller, South Burlington, both of Vt.

[73] Assignee: International Business Machines Corporation, Armonk, N.Y.

[21] Appl. No.: 08/853,963

[22] Filed: May 9, 1997

[51] Int. Cl.[7] ........................ H03K 3/295; H03K 19/0948
[52] U.S. Cl. .......................... 327/206; 327/78; 327/333; 327/391; 326/27; 326/68
[58] Field of Search ................... 327/205, 206, 327/77, 78, 79, 89, 333, 384, 391, 73, 68, 72; 326/68, 81, 27

[56] References Cited

U.S. PATENT DOCUMENTS

| | | | |
|---|---|---|---|
| 4,110,641 | 8/1978 | Payne | 327/67 |
| 4,371,843 | 2/1983 | Fang et al. | 330/253 |
| 4,438,349 | 3/1984 | Shoji | 327/85 |
| 4,571,504 | 2/1986 | Iwamoto et al. | 327/206 |
| 4,612,466 | 9/1986 | Stewart | 327/437 |
| 4,786,825 | 11/1988 | O'Shaughnessy et al. | 327/206 |
| 4,937,476 | 6/1990 | Bazes | 326/71 |
| 5,278,467 | 1/1994 | Nedwick | 327/52 |
| 5,293,515 | 3/1994 | Uchida et al. | 327/51 |
| 5,334,883 | 8/1994 | Rosenthal | 327/206 |
| 5,362,994 | 11/1994 | Lin | 327/206 |
| 5,587,674 | 12/1996 | Danstrom | 327/206 |
| 5,594,361 | 1/1997 | Campbell | 327/206 |
| 5,627,458 | 5/1997 | Nevin | 323/267 |
| 5,654,645 | 8/1997 | Lotfi | 327/206 |

*Primary Examiner*—Timothy P. Callahan
*Assistant Examiner*—Terry L. Englund
*Attorney, Agent, or Firm*—Mark F. Chadurjian

[57] ABSTRACT

A self biased differential amplifier has a switching point accurately set according to a reference voltage. DC hysteresis is provided, by a circuit internal to the differential amplifier. The amplifier has an input circuit having first and second series connected transistors, wherein the beta ratio of these first and second transistors is changed by enabling an additional transistor of a hysteresis circuit according to an output state of the differential amplifier. When the output state is "high", the switching point is decreased in order that temporary small drops (due to noise or glitches) in the input signal are ignored. Conversely, when the output state is "low", the switching point is increased in order that temporary small increases in the input signal are ignored.

15 Claims, 6 Drawing Sheets

SELF BIASED DIFFERENTIAL AMPLIFIER WITH HYSTERESIS

FIELD OF THE INVENTION

The present invention relates generally to input buffer circuits, and more particularly, to an input buffer having an ability to dynamically modify its switching point based upon a logic level present at the input.

BACKGROUND OF THE INVENTION

Several different integrated circuit technologies are available to circuit and system designers in which to realize their designs. These technologies include for example, bipolar, complementary metal oxide semiconductor (CMOS), bipolar-CMOS (Bi-CMOS), gallium arsenide (GaAs), and others. As would be expected, integrated circuits based on differing technologies, or based on differing logic families within a technology, are often required to operate within a single system, and hence must accurately communicate one with another. A common problem that must be dealt with is the differing logic level voltages associated with the differing technologies, or between differing circuit families within a single technology. This problem is sometimes further exacerbated by supply voltage levels which may vary significantly, not only between different technologies, but even amongst circuits of like technologies. Additionally, it is now common to have a higher voltage to operate input/output circuits and a second lower voltage to operate internal circuits. In order to deal with such differences between circuits and technologies, designers rely upon input buffer circuits (also known as voltage translators) that are capable of translating input signal levels from an external circuit into needed logic levels of internal circuits.

Figure 1:
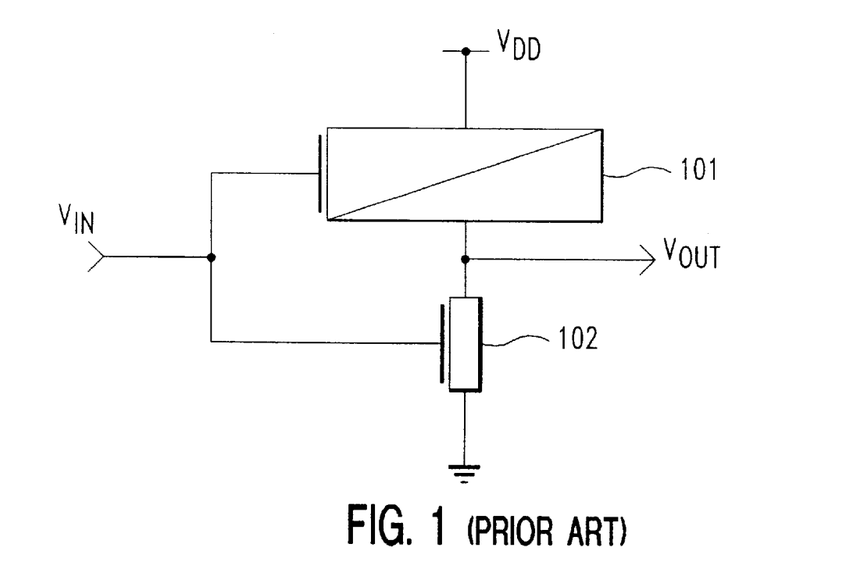
FIG. 1 is a circuit diagram of a prior art input inverter.

The input signal levels from the external source need to be made compatible with internal switching levels, typically at the input buffer circuit. One CMOS inverter solution for modifying the circuit threshold voltages involves simply ratioing the two transistors making up an inverter at the input as shown in FIG. 1. Here, the width to length (W/L) ratio of P-type transistor 101 is made much larger than the W/L ratio of N-type transistor 102. The actual effect of this technique upon the switching point is small. This technique, however, also causes vastly unsymmetrical performance because the much larger P-type transistor 101 provides for a much faster rise time than a corresponding fall time provided by N-type transistor 102.

Figure 2:
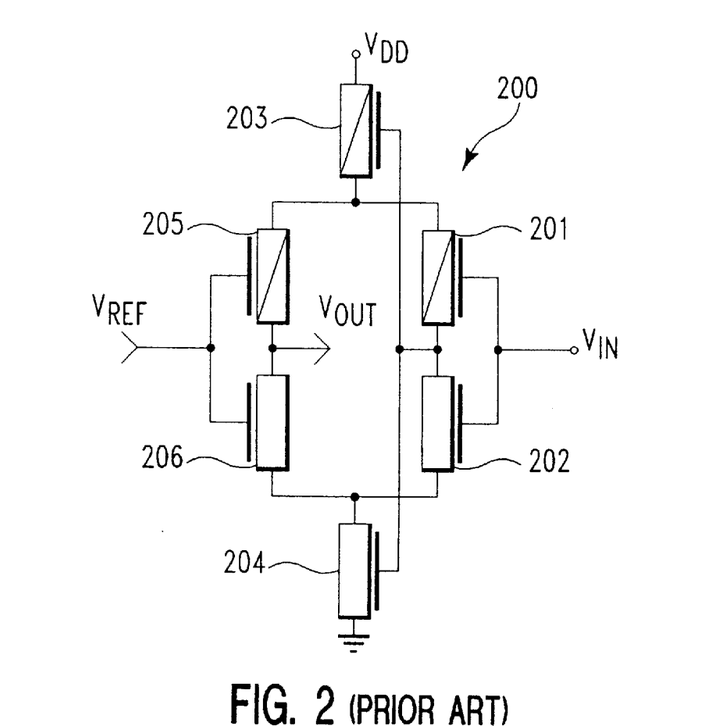
FIG. 2 is a circuit diagram of a prior art self biased differential amplifier circuit for translating input logic levels.

New standard integrated circuit interfaces, however, require differential interfaces, for example, the stub series terminated logic (SSTL), a EIA/JEDEC standard. A Wilson current mirror, as is well known in the art, is useful as a differential input receiver. The Wilson current mirror, however, requires a bias device (possibly a bandgap regulator) for improved performance. Hence, a further improvement on the Wilson current mirror would be a differential amplifier which is self biased. Such a circuit 200 is depicted in FIG. 2 which works very well for a wide range of input logic levels so long as the power supply voltage levels are maintained at a sufficiently high magnitude. The circuit 200 includes an input stage including transistors 201 and 202, a reference stage including transistors 205 and 206, and a bias source having transistors 203 and 204. This circuit 200 provides high gain essentially by modulating the bias source (203, 204) as a function of the incoming logic input signal, $V_{IN}$. In addition to higher gain, cross-over currents can be almost eliminated because a logic low output does not require the source supply, and conversely, a logic high output does not require the ground supply. Those skilled in the art will recognize that the function of the input stage and reference stage can be transposed, that is, $V_{IN}$ can be connected to the reference stage such that the bias source is modulated as a function of the reference stage.

While the circuit 200 is an improvement over prior art circuits, there are also some drawbacks that exist with this solution. For example, by providing a high current, high gain and high bandwidth solution, the circuit 200 also introduces the propagation of noise and glitches. These problems occur because the amplifier is so fast that small perturbances at the input can be amplified and presented at the output. A one shot circuit could be added at the output of the circuit 200 to effectively lock out noise and glitches for some predetermined time (a time dependent solution). However, when that predetermined time is exhausted, any additional noise or glitch will still be propagated through. This may be more acceptable in circuits where the output of the circuit 200 is latched within the predetermined time such that later propagated errors are ignored. A non-time dependent solution includes adding a Schmidt trigger at the input thus introducing DC hysteresis (i.e., the switch point exhibits a differential between the logic high level and logic low level inputs). Yet another solution includes adding a filter stage to filter noise and suppress glitches. These solutions help to alleviate the propagation problems at a cost of additional delays, some behavioral unpredictability due to the randomness of noise, and additional design time. Thus, what is needed is a mechanism internal to the differential amplifier that is able to alleviate the problem of propagating noise or glitches through the circuit independent of time, without additional delay or operation unpredictability.

Accordingly it is desired to provide a self biased differential amplifier having DC hysteresis that does not further delay the input signal and that is predictable and easily designed into the circuit.

SUMMARY OF THE INVENTION

An object of the present invention is to provide an improved input circuit for translating logic level signals input thereinto.

Another object of the present invention is to provide an input circuit having high gain and high bandwidth with non-time dependent switching point modification that is dependent upon a logic levels present at the input.

Still another object of the present invention is to provide a self biased differential amplifier circuit that operates to dynamically modify its switching point by effectively altering a relative current carrying capacity of input switching devices according to the logic level at the input. According to a first embodiment of the present invention, a method of dynamically adjusting a predetermined switching point of a differential amplifier circuit is provided in a semiconductor device. The semiconductor device is coupled to an external supply voltage. The differential amplifier circuit receives a logic signal input having first and second states, and devices in the input circuit have a predetermined current ratio and are coupled to a reference circuit, each further coupled to a bias circuit. The method includes the steps of deriving a reference voltage for application to the reference circuit, wherein the reference voltage has a voltage magnitude substantially equal to a voltage magnitude of the predetermined switching point. The bias circuit is biased according to the derived reference voltage, which bias circuit is realized within the semiconductor circuit. The logic input signal is received at the input circuit. The logic input signal is translated in the differential amplifier circuit to an output having an output in a first state when the logic input signal is in a first state, and the logic input signal is translated at the output to a second state when the logic input signal is in a second state. The switching point is modified to a lower voltage level when the output changes to the first state by modifying the current ratio in a first direction in the devices in the input circuit. The predetermined switching point is modified to a higher level when the output changes to the second state by modifying the current ratio in a second direction in the input circuit.

According to another embodiment of the present invention, an integrated circuit has at least one differential amplifier circuit integrated thereon which receives a logic input signal. The differential amplifier circuit has a predetermined switching point, wherein the differential amplifier circuit provides hysteresis about the predetermined switching point. The differential amplifier circuit includes a reference circuit having a reference voltage applied thereto, and an input circuit adapted for receiving the logic input signal. A beta ratio exists between switching devices in the input circuit. A current source is coupled to the reference circuit and to the input circuit for providing a reference current thereto. A hysteresis circuit has an input coupled to an output of the differential amplifier circuit, and has an output coupled to bias said current source. The hysteresis circuit modifies the beta ratio of the input circuit in a first direction when the output is in a first state and modifies the beta ratio in a second direction when the output is in a second state.

The foregoing and other objects, features, and advantages of the invention will be apparent from the following more particular description of a preferred embodiment of the invention, as illustrated in the accompanying drawing.

DETAILED DESCRIPTION

Figure 3:
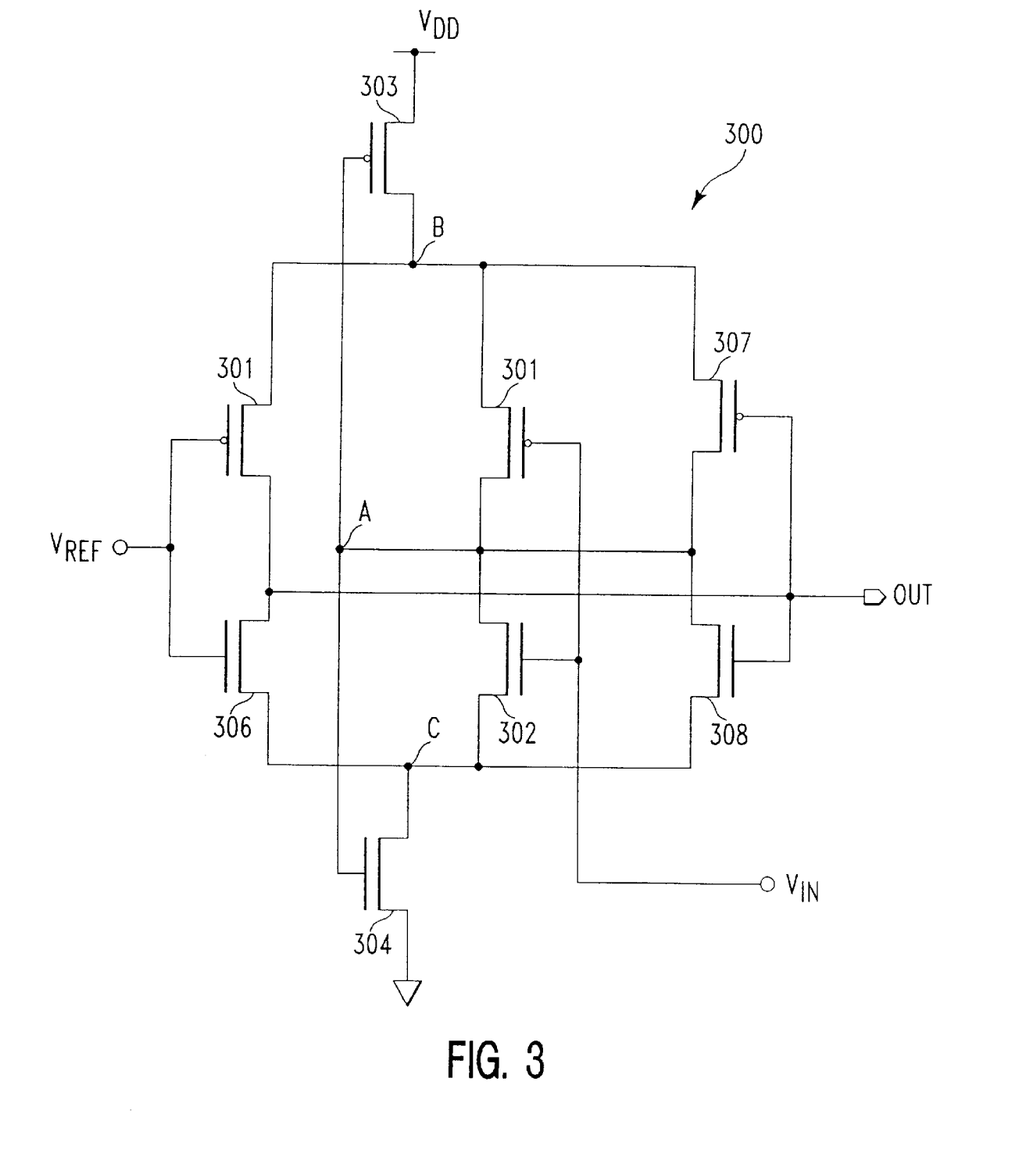
FIG. 3 is a circuit diagram of a self biased differential amplifier according to a preferred embodiment of the present invention.

Referring now to the figures, and for the present to FIG. 3, a circuit diagram of a self biased differential input amplifier circuit 300 is shown. The differential amplifier 300 includes an input inverter made up of series connected transistors 301 and 302 that are further connected in series with a bias source made up of transistors 303 and 304. Transistor 303 is connected to a supply voltage and transistor 304 is connected to a ground voltage. The inverter (301, 302) receives $V_{IN}$ (input logic level) at an input and has an output connected to an input of the bias source (303, 304). A voltage reference inverter includes series connected transistors 305 and 306 that are connected in parallel to the input inverter (301, 302), and whose input receives a reference voltage, $V_{REF}$. The improved time independent switching operation of the differential amplifier 300 is accomplished, in part, by the addition of hysteresis feedback transistors 307 and 308.

The hysteresis feedback transistors 307 and 308 are series connected and also in parallel with the input inverter (301, 302). An output of the hysteresis feedback transistors (307, 308) is connected to an input of the bias source (303, 304) and the output of the input inverter (301, 302). An input of the hysteresis feedback transistors (307, 308) is connected to an output of the voltage reference inverter (305, 306) and is also the output node, $V_{OUT}$, of the differential amplifier 300. The voltage reference inverter (305, 306) is biased by $V_{REF}$ which is a stable DC voltage about which $V_{IN}$ swings above for a logic level "one" and swings below for a logic level "zero." Thus, $V_{REF}$ has a voltage magnitude substantially equal to the desired switching point of the input inverter (301, 302) and hence the desired switching point of the differential amplifier 300. $V_{REF}$ can be generated internally on chip, or derived from the external signal source so that internal switching levels will track external voltage conditions (e.g., a voltage divider of the external supply voltage). Without the addition of the hysteresis feedback (307, 308), a change in the input logic level, even slightly above or below $V_{REF}$, will cause the voltage at the output to switch (false switching) to the corresponding state of the input logic level (as may be caused by noise or glitches).

Adding the hysteresis feedback (307, 308) alters the operation of the differential amplifier 300 by effectively filtering noise and glitches independent of time by effectively altering a ratio of the transistor sizes (the "beta" ratio) of transistors 301 and 302, depending upon the value of $V_{OUT}$. Since the switching point is primarily determined by $V_{REF}$ and the beta ratio of transistors 301 and 302, dynamically modifying this beta ratio (i.e., according to the input logic level) also dynamically modifies the switching point. More specifically, the switching point is modified to a lower level when the output, $V_{OUT}$, is a logic "one" (the input logic level is "one"), and conversely to a higher level when the output is a logic "zero" (the input logic level is "zero"). Hence, when the output is caused to go "high" then $V_{IN}$ would have to reach yet a lower magnitude then previously required when $V_{OUT}$ was "low" to now cause the output to go "low." That is, the switching point has dynamically moved higher in response to the high output voltage. Alternately, when the output is caused to go "low" then $V_{IN}$ would have to reach yet a higher magnitude than previously to cause the output to now go "high." That is, the switching point has dynamically moved higher in response to the low output voltage. The relationship of the phase between $V_{IN}$ and $V_{OUT}$ is not important to the present invention, that is, a phase inversion therebetween is acceptable so long as the output level affects the switching point as necessary to provide the desired hysteresis.

In operation, upon receiving $V_{IN}$ as a logic level "one" input, transistor 302 is biased on hard (conducts current) such that a voltage at node A is pulled "low." Transistor 303 is in turn biased on hard while a conductance of transistor 304 is reduced. In this state, a voltage at node B approaches the supply voltage, VDD, and a voltage at node C rises to a level sufficient to nearly cut off transistor 306 (near non-conducting state). Transistor 305 is in the conducting state thus causing the output of the reference inverter (301, 302) to go "high." The "high" output turns transistor 308 on, and turns transistor 307 off. Hence transistor 307 does not affect circuit operation but transistor 308 effectively increases the size (width in this instance) of transistor 302, and hence modifies the beta ratio on input inverter (301, 302), so that the switching point is decreased thus providing the desired hysteresis.

The converse is true when receiving $V_{IN}$ as a logic level "zero" input. Now, transistor 302 is biased in a non-conducting state such that the voltage at node A is able to rise, although now transistor 303 is near a non-conducting state and transistor 304 is biased on hard. The voltage at node C can now approach the ground voltage (transistor 305 is in the non-conducting state) and the output of the reference inverter (305, 306) now goes "low." The "low" output voltage biases transistor 308 off so that it essentially does not affect circuit operation while the transistor 307 is biased "on." Now, the size (width in this instance) of transistor 301 is effectively increased such that the switching point is increased and again providing the desired hysteresis. Although hysteresis transistors (307, 308) are shown connected in parallel to the input inverter (301, 302), similar results in the operation may be achieved in modifying the beta ratio of the input inverter (301, 302) by other means without departing from the invention described herein.

Figure 4:
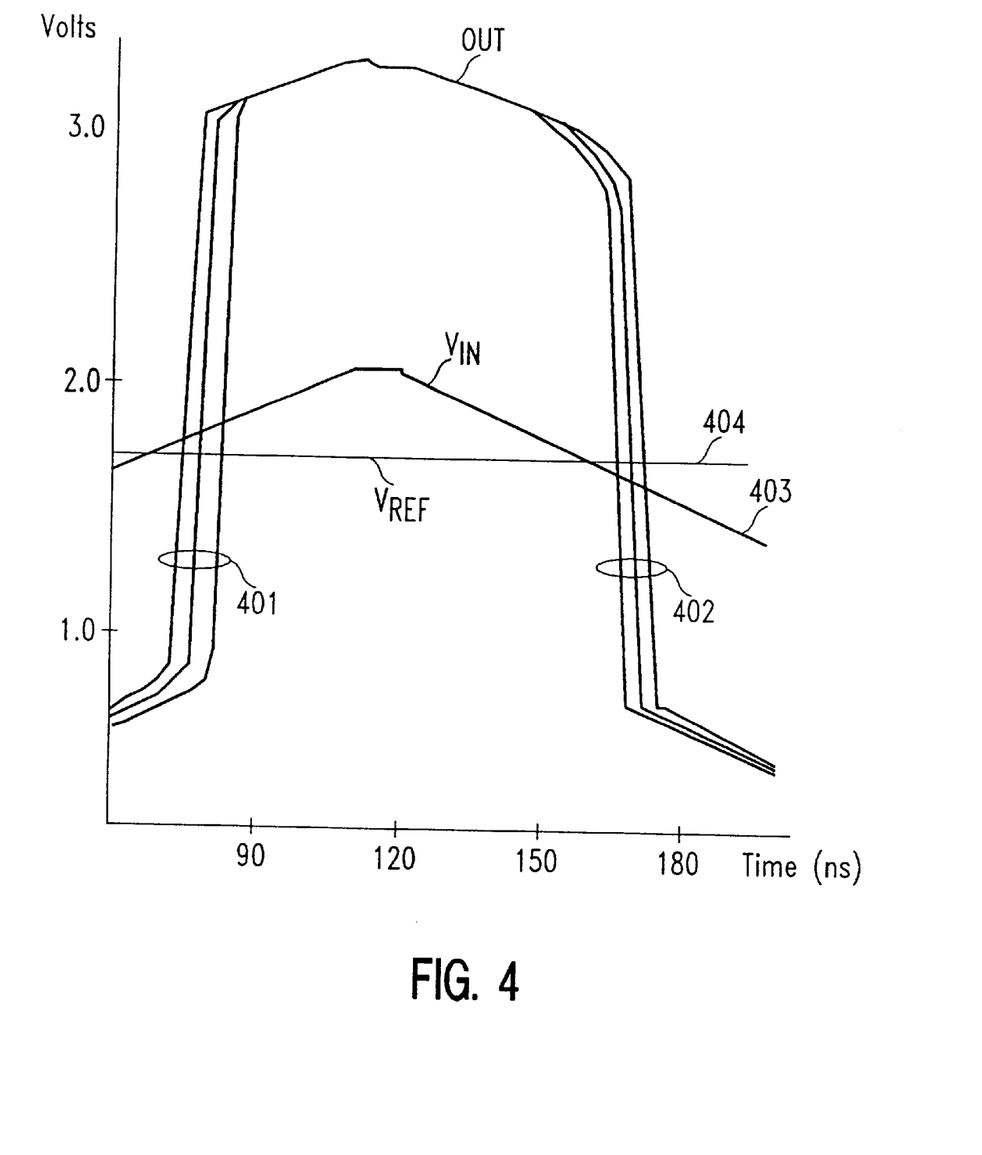
FIG. 4 is a static (DC) response curve showing simulated hysteresis effects on the differential amplifier 300 for different transistor sizes.

Referring now to FIG. 4, a response curve showing the simulation results of the differential amplifier 300 having hysteresis is shown. In this simulation example, a power supply voltage ($V_{DD}$) is shown on the Y-axis while the X-axis shows the relative time. $V_{REF}$ is shown by curve 404, for the desired switching point, for example, 1.73 volts, and VIN is shown by curve 403, varying about $V_{REF}$. Curves 401 show that the switching point is successfully shifted higher with increasing sizing of 307, for example, to 1.79 volts for a 2 micron wide device, to 1.83 volts for a 4 micron wide device, and to 1.87 volts for a 6 micron wide device. Similarly, curves 402 show that the switching point is successfully shifted lower with increasing sizing of transistor 308, for example, to 1.66 volts for a 1 micron wide device, to 1.62 volts for a 1.5 micron wide device, and to 1.58 volts for a 2 micron wide device. Importantly, the switching point effects caused by changes in transistor 307 are independent of those caused by changes in transistor 308 and vice-versa.

Figure 5:
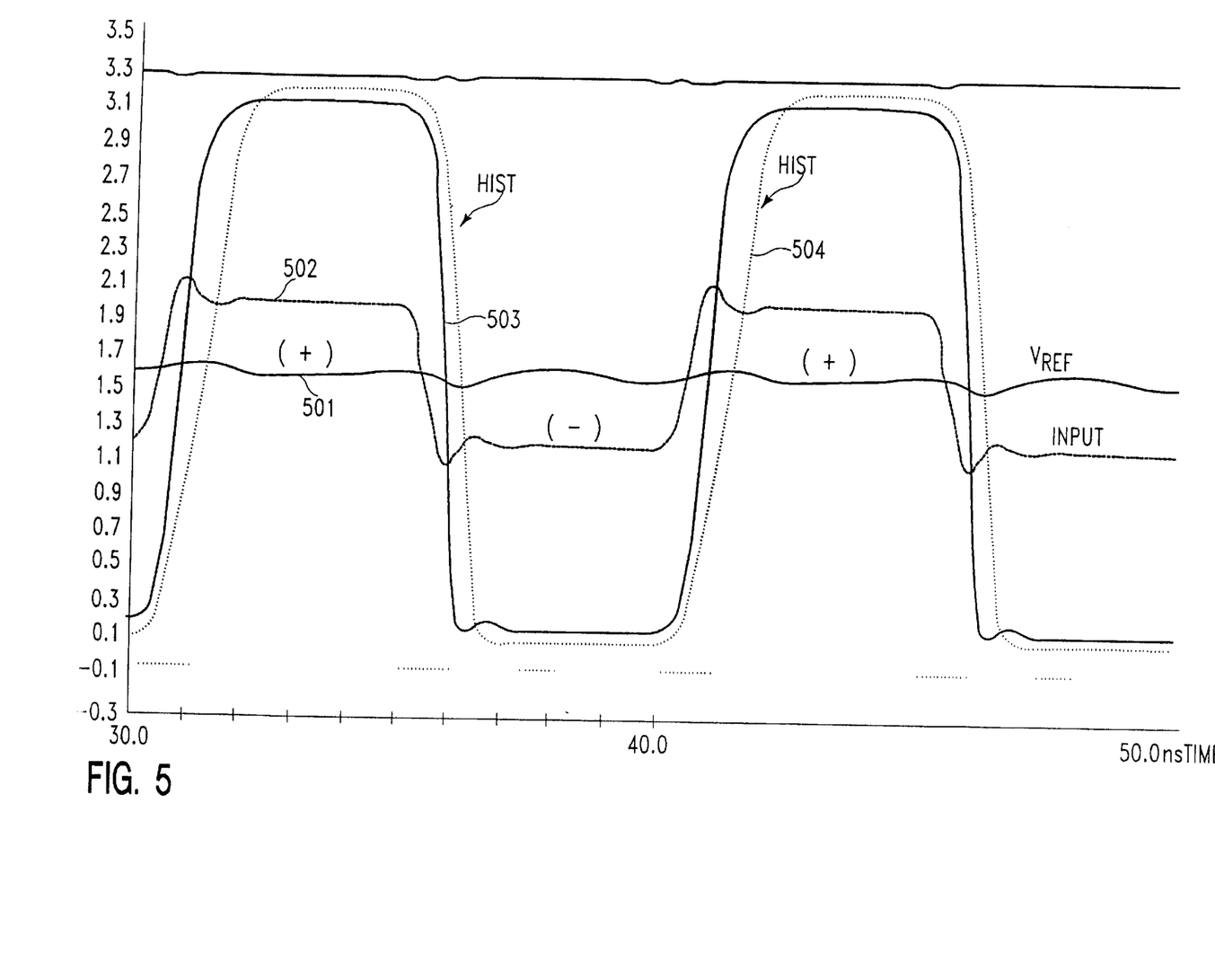
FIG. 5 is a timing diagram showing simulated propagation delay effects on the circuit 300 as a result of adding internal hysteresis.

FIG. 5 depicts the simulated effects that adding hysteresis internal to the differential amplifier 300 has upon the propagation delay therein. Curve 501 shows $V_{REF}$, for example, set at approximately 1.6 volts. $V_{IN}$ is represented by curve 502, and swings between approximately 1.2 volts and 2.0 volts. The output, without transistor 307 and 308, and hence, without hysteresis, is depicted by curve 503. Adding transistors 307 and 308, and hence, hysteresis, causes a slight propagation delay in the differential amplifier of approximately one-half nano-second as shown by curve 504. Therefore, the impact of the hysteresis upon propagation delay is minimal.

Figure 6:
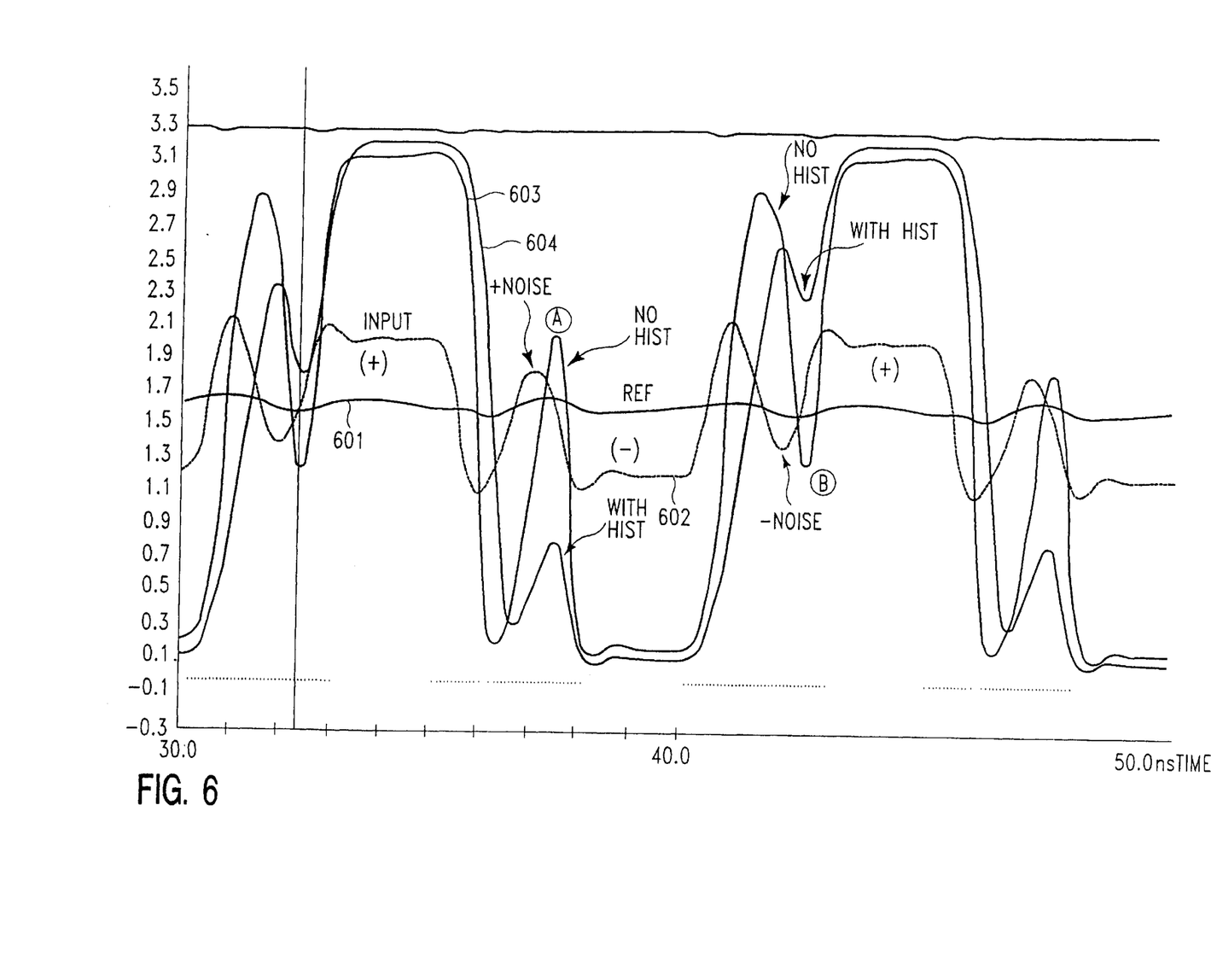
FIG. 6 is a timing diagram showing simulated glitch suppression results in the differential amplifier 300.

Referring now to FIG. 6, $V_{REF}$ is represented by curve 601 and $V_{IN}$ is represented by curve 602. This time, noise spikes are introduced at $V_{IN}$. When hysteresis is absent from the differential amplifier 300, the noise spikes are propagated to the output, for example, at points A and B of curve 603, such that undesired logic switching occurs that can be propagated to other circuits. Adding hysteresis according to the preferred embodiment of the present invention, however, suppresses the noise spikes as demonstrated by curve 604.

Figure 7:
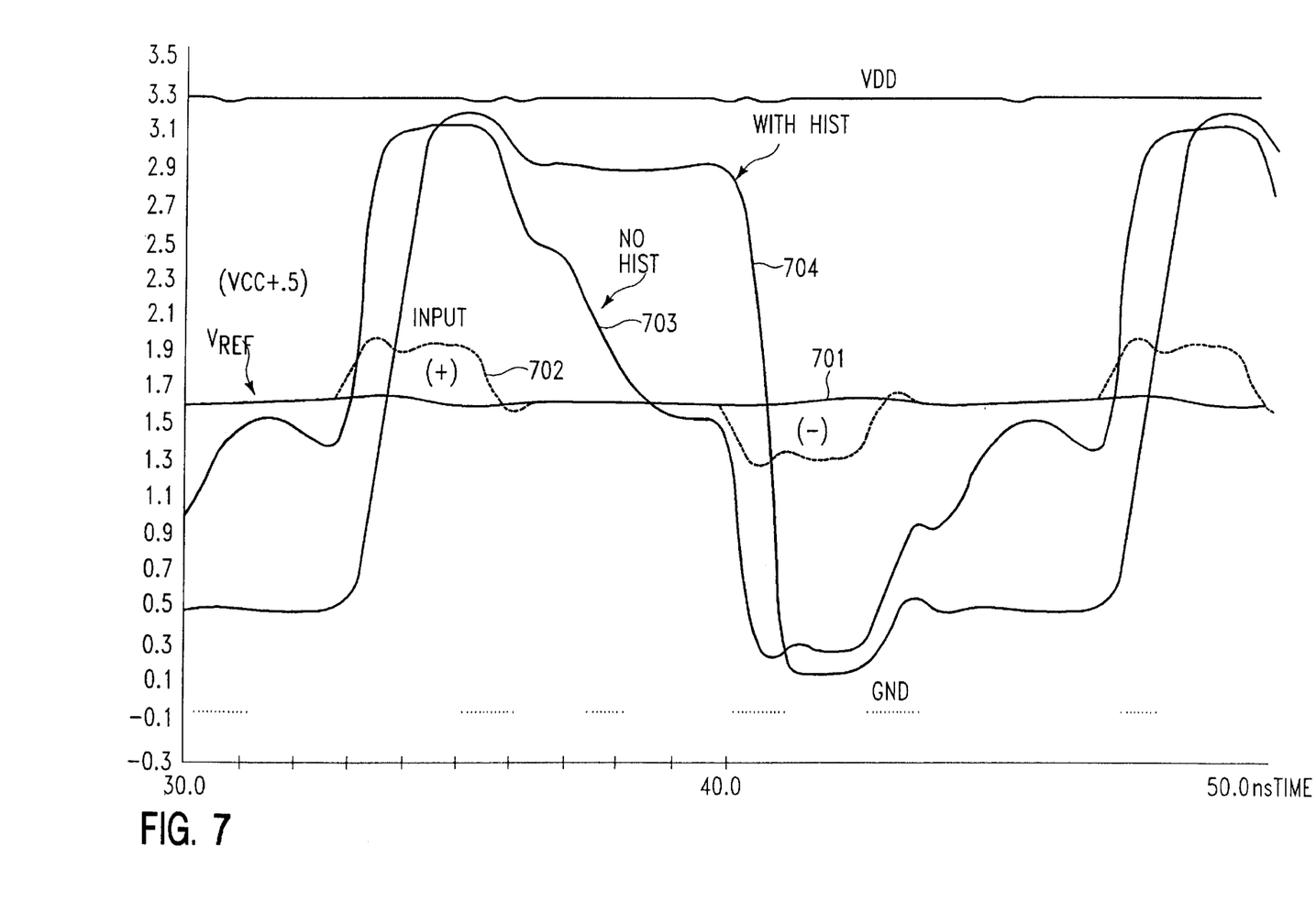
FIG. 7 is a timing diagram showing simulated output result for maintaining a correct output for a varying input logic level in the differential amplifier 300.

FIG. 7 demonstrates the ability of the differential amplifier 300 having hysteresis to prevent the propagation of unwanted changes in the output state due to changes in $V_{IN}$ (curve 702) about $V_{REF}$ (curve 701). When $V_{IN}$ drops slightly below $V_{REF}$ for several nano-seconds, the output of the differential amplifier 300 changes states from a steady state "high" to a "low" undesirably when hysteresis is absent (curve 703), and vice versa when in the steady state "low" condition. However, this problem is corrected as shown by curve 704 such that such changes in the level of $V_{IN}$ does not cause undesired changes of state of the output. An important benefit provided is that during quiescent periods, when input signals may relax to $V_{REF}$, the differential amplifier 300 will remain in its last state, thus avoiding the problem of burning excessive current in the differential amplifier 300 and succeeding stages. Thus the differential amplifier 300 effectively latches and propagates its last valid state.

While the invention has been particularly shown and described with reference to preferred embodiments thereof, it will be understood by those skilled in the art that various changes in form and details may be made therein without departing from the spirit and scope of the invention. For example, the form of modifying the beta ratio of the input inverter may vary from that shown in the preferred embodiment. Further, the phase relationship of the input to the output, relative to the hysteresis effect may also change without departing from the invention described herein. Voltage magnitudes are given as examples, including input logic levels and $V_{REF}$, and are not meant to be invention limitations. Still further, VIN and VREF can be transposed as connected to the differential amplifier Changes in future embodiments of the invention can therefore be made without departing from the teachings herein.

What is claimed is:

1. A method of dynamically adjusting a predetermined switching point of a differential amplifier circuit within a semiconductor circuit coupled to an external supply voltage, said differential amplifier circuit receiving a logic input signal having first and second states, said differential amplifier circuit having (i) an input circuit with a predetermined current ratio, (ii) a reference circuit, and (iii) a bias circuit, all of said input, reference, and bias circuits being coupled to one another, said method comprising the steps of:

(a) deriving a reference voltage for application to said reference circuit, said reference voltage having a voltage magnitude substantially equal to a voltage magnitude of the predetermined switching point;

(b) receiving the logic input signal at said input circuit;

(c) biasing said bias circuit with the derived reference voltage and the logic input signal;

(d) translating said logic input signal to an output from said differential amplifier circuit having a first state when the logic input signal is in the first state and a second state when the logic signal is in the second state;

(e) modifying the predetermined switching point to a lower voltage level when the output of the differential amplifier circuit changes form the second state to the first state by modifying the current ratio of the input circuit in a first direction; and (f) modifying the predetermined switching point to a higher voltage level when the output of the differential amplifier circuit changes from the first state to the second state by modifying the current ratio in the input circuit in a second direction.

2. The method according to claim 1 wherein the reference voltage is derived from the external supply voltage.

3. The method according to claim 1 wherein the reference voltage is derived from an internal supply voltage generated on said semiconductor circuit.

4. The method according to claim 1 wherein said current ratio of said input circuit is directly related to a beta ratio of first and second transistors of said input circuit, wherein said modifying steps (e) and (f) are realized by changing the beta ratio in response to the change in the state of said output of said differential amplifier circuit.

5. The method according to claim 4 wherein said beta ratio is changed in the first direction by increasing a current capability of said first transistor relative to a current capability of the second transistor.

6. The method according to claim 5 wherein said beta ratio is changed in the second direction by increasing the current capability of said second transistor relative to the current capability of said first transistor.

7. The method according to claim 4 wherein modifying the beta ratio in response to the change in the output state of said differential amplifier circuit provides DC hysteresis to said differential amplifier circuit.

8. An integrated circuit having a differential amplifier circuit integrated thereon for receiving a logic input signal, said differential amplifier circuit having a predetermined switching point, said differential amplifier circuit providing hysteresis about said predetermined switching point, said differential amplifier circuit comprising:

a reference circuit having a reference voltage applied thereto;

an input circuit for receiving the logic input signal, said input circuit having a beta ratio associated therewith;

a current supplying device coupled to said reference circuit and to said input circuit for providing a reference current thereto; and a hysteresis circuit having an input coupled to an output of said differential amplifier circuit, and having an output coupled to bias said current supplying device, said hysteresis circuit modifying the beta ratio of said input circuit in a first direction when the output of said differential amplifier circuit is in a first state and modifying the beta ratio in a second direction when the output of said differential amplifier circuit is in a second state.

9. The integrated circuit according to claim 8 wherein said input circuit comprises a first inverter having first and second transistors serially connected between two nodes of the current supplying device, said first and second transistors each having a gate coupled for receiving the logic input signal.

10. The integrated circuit according to claim 9 wherein said reference circuit comprises a second inverter having third and fourth transistors serially connected between the two nodes of the current supplying device, said third and fourth transistors each having a gate coupled for receiving the reference voltage.

11. The integrated circuit according to claim 10 wherein said hysteresis circuit comprises a fifth transistor, wherein said fifth transistor is coupled to said first transistor in response to a change in the state of said output of said differential amplifier circuit for effectively modifying a current carrying capability of the first transistor relative to said second transistor.

12. The integrated circuit according to claim 11 wherein said hysteresis circuit further comprises a sixth transistor, wherein said sixth transistor is coupled to said second transistor in response to the change in the state of said output of said differential amplifier circuit for effectively modifying a current carrying capability of the second transistor relative to said first transistor.

13. An integrated circuit having a differential amplifier circuit integrated thereon for receiving a logic input signal, said differential amplifier circuit having a predetermined switching point with output controlled hysteresis about said predetermined switching point, said differential amplifier circuit comprising:

a reference inverter having a reference voltage applied to an input thereof;

an input inverter for receiving the logic input signal, said input inverter having a beta ratio associated therewith;

a current supplying device coupled for providing a reference current to said reference inverter and to said input inverter, said current supplying device further having an input coupled to an output of said input inverter; and a hysteresis circuit having an input coupled to an output of said reference inverter, and having an output coupled to the input of said current supplying device, said hysteresis circuit modifying the beta ratio of said input inverter in a first direction when said output of said reference inverter is in a first state and modifying the beta ratio in a second direction when said output of said reference inverter is in a second state.

14. The integrated circuit according to claim 13 wherein said hysteresis circuit further comprises first and second series connected transistors which are selectively enabled for modifying the beta ratio of said input inverter according to said state of the output of said reference inverter.

15. An integrated circuit having a self biased differential amplifier with hysteresis integrated thereon, said self biased differential amplifier comprising:

a first inverter having first and second series connected transistors coupled for receiving a first signal;

a second inverter having series connected third and fourth transistors coupled for receiving a reference voltage;

a bias circuit having a fifth transistor coupled between a supply voltage and the first and third transistors, and having a sixth transistor coupled between a ground supply voltage and said second and fourth transistors, a gate of said fifth transistor and a gate of said sixth transistor coupled to an output of said first inverter; and a hysteresis inverter comprising seventh and eighth series connected transistors having an input connected to an output of said second inverter, and having an output connected to the output of said first inverter.

* * * * *